United States Patent [19]

Miura et al.

[11] 4,254,197

[45] Mar. 3, 1981

[54] PROCESS OF FORMING PHOTORESIST LAYER ON A GLASS SUBSTRATE

[75] Inventors: Kiyoshi Miura; Naomitsu Watanabe; Yoshifumi Tomita, all of Mobara, Japan

[73] Assignee: Hitachi, Ltd., Japan

[21] Appl. No.: 970,363

[22] Filed: Dec. 18, 1978

Related U.S. Application Data

[63] Continuation of Ser. No. 496,854, Aug. 12, 1974, abandoned.

[30] Foreign Application Priority Data

Oct. 24, 1973 [JP] Japan ............................ 48-119006

[51] Int. Cl.³ .................... G03C 1/74; G03C 1/92; G03C 1/71
[52] U.S. Cl. ............................ 430/28; 430/23; 430/167; 430/196; 430/272
[58] Field of Search ............... 96/91 N, 115 R, 75, 96/91 R, 93; 430/196, 28, 167, 289, 23, 272

[56] References Cited

PUBLICATIONS

Grant, J., "Hackh's Chemical Dictioanry," 4th Ed., 1969, p. 302 relied on.

*Primary Examiner*—Charles L. Bowers, Jr.
*Attorney, Agent, or Firm*—Craig & Antonelli

[57] ABSTRACT

When a low molecular weight dihydric or trihydric alcohol is added to a photoresist composition comprising a water-soluble polymer substance and a bisazide photo-crosslinking agent, the fluidity of the composition is improved and the drying speed is moderately retarded and it enables the formation of a photoresist layer having a uniform film thickness and uniform drying degree. The said alcohol is exemplified by ethylene glycol, glycerol, etc. and is preferably added in an amount of 5-300 parts by weight per 100 parts by weight of the water-soluble polymer substance.

7 Claims, No Drawings

PROCESS OF FORMING PHOTORESIST LAYER ON A GLASS SUBSTRATE

This is a continuation of application Ser. No. 496,854, filed Aug. 12, 1974, now abandoned.

The present invention relates to a photoresist composition. More particularly, the invention pertains to a photoresist composition which can prevent coating unevenness or drying unevenness in the formation of a photoresist layer.

Photoresists comprising a water-soluble polymer substance and a bisazide photo-crosslinking agent have heretofore been used widely in photographic printing or photo-etching. It is necessary for this object to form a photoresist layer on the surface of an appointed base plate or a member to be etched. It is generally carried out by rotational coating method. The photoresist layer has characteristics that it directly forms an image and its sensitivity remarkably varies according to a difference in film thickness and drying degree after coating. Therefore, said photoresist layer should have a uniform film thickness and be dried uniformly to obtain an even image of a high precision.

In the prior art formation of a photoresist layer, r.p.m. in rotational photoresist coating method or drying temperature is fixed at an appropriate value taking into account the viscosity of photoresist or the surface state of a material to be coated. However, the prior art photoresist has a defect that it is difficult to determine the above-mentioned appropriate values and a uniform coating film is difficult to obtain particularly when the base plate has a large area or a special shape, since drying is comparatively rapidly finished and the fluidity of the photoresist is poor.

An object of the present invention as to enable the formation of a photoresist layer having a uniform film thickness by increasing the fluidity of the photoresist coated and retarding drying moderately in view of the above-mentioned defect of the prior art method. The object of the invention can be obtained with a photoresist composition containing a low molecular weight dihydric or trihydric alcohol.

Said alcohol is added in an amount of 5-300 parts by weight, and preferably 20-200 parts by weight, per 100 parts by weight of a water-soluble polymer substance. If the amount of the alcohol added is less than the above-mentioned values, the desired effect cannot be obtained. Also, if the amount added is more than the above-mentioned values, sensitivity or resolving power is reduced.

The water-soluble polymer substances which may be used in the present invention include gelatine, homopolymers such as polyacrylamide, polyvinyl pyrrolidone, polyvinyl methyl ether and polyvinyl acetal, and copolymers such as acrylamide-diacetone acrylamide copolymer, acrylamide-vinyl methyl ether copolymer, maleic acid-vinyl methyl ether copolymer and acrylamidevinylpyrrolidone copolymer. Also, the bisazide photo-crosslinking agent is exemplified by 4,4'-diazidostilbene-2,2'-disulfonic acid, 4,4'-diazidostilbene-α-carboxylic acid and metal salts thereof.

As the low molecular weight dihydric or trihydric alcohol used in the present invention, there are used alcohols which are water-soluble, compatible with the water-soluble polymer substances and in the form of a liquid at ordinary temperature and which are difficult to evaporate owing to their boiling point higher than that of water, as their molecular weight, melting point and boiling point are shown in the table below. As such an alcohol, ethylene glycol, diethylene glycol, propylene glycol, dipropylene glycol, 1,3-butylene glycol, 1,5-pentanediol, glycerol, etc. are effective. If the molecular weight of these alcohols is too high, the fluidity of the photoresist becomes poor and coating film-uniformizing effect is reduced. Therefore, the alcohols preferably have a molecular weight of 60-110.

| Alcohol | Molecular weight | Melting point (°C.) | Boiling point (°C.) |
| --- | --- | --- | --- |
| Ethylene glycol | 62.07 | −12.6 | 197.7 –197.8 |
| Diethylene glycol | 106.12 | −11.5 | 245.0 |
| Propylene glycol | 76.10 | Liquid | 188.2 |
| Dipropylene glycol | 134.18 | Liquid | 229.2 |
| 1,3-Butylene glycol | 90.12 | Liquid | 192 |
| 1,5-Pentanediol | 104.15 | −18 | 239 –240 |
| Glycerol | 92.10 | 18 | 290 |

Also, vinyltris($\beta$-methoxyethoxy)silane, N-$\beta$-(aminoethyl)-$\gamma$-aminopropylmethyldimethoxysilane, N-$\beta$-(aminoethyl)-$\gamma$-aminopropyltrimethoxysilane, etc. are often added to the photoresist as an adhesiveness improver, but it does not matter for obtaining the effect desired in the present invention.

The photoresists according to the present invention containing the above-mentioned dihydric or trihydric lower molecular weight alcohols become a solution of a high boiling point which is difficult to evaporate and their fluidity is increased by reduction in their viscosity. On coating of the photoresists, therefore, a uniform coating film can be easily obtained irrespective of the shape of a base plate to be coated or the coating area and the influence of r.p.m. in rotational coating method is reduced. Further, on drying of the photoresists, drying is retarded and thereby it is possible to prevent drying unevenness caused by a change in drying temperature or heating unevenness and form a photoresist layer having a uniform film thickness.

The following examples, in which all parts are expressed by weight, unless otherwise indicated, will serve to illustrate the practice of the invention in more detail.

EXAMPLE 1

Two photoresist liquids were prepared by dissolving one part of polyacrylamide as a water-soluble polymer substance and 0.2 part of sodium 4,4'-diazidostilbene-2,2'-disulfonate as a bisazide crosslinking agent in 100 parts of water and then adding or not adding 0.2 part of ethylene glycol to the solution. Each photoresist liquid was dropped onto a 200 mm × 150 mm glass base plate, rotation-coated at 150 r.p.m. and dried by a 100 W infrared heater for 5 minutes to form a photoresist layer. An optical mask, in which round holes of 0.4 mm in diameter were two-dimentionally arranged at a pitch of 0.65 mm, was placed at a distance of about 1 cm from the photoresist layer. Exposure was carried out with a point source of light and development was then carried out by a water spray (water pressure 1 kg/cm$^2$). When the respective images thus obtained were observed, it was found that the image formed with the photoresist containing ethylene glycol produced no unevenness in contrast with the image formed with the photoresist containing no ethylene glycol.

EXAMPLE 2

Two photoresists were prepared by dissolving a water-soluble polymer substance consisting of 0.5 part of polyvinyl pyrrolidone and 0.5 part of polyacrylamide, 0.4 part of sodium 4,4'-diazidostilbene-2,2'-disulfonate as a bisazide crosslinking agent and 0.05 part of N-$\beta$-(aminomethyl)-$\gamma$-aminopropyltrimethoxysilane as an adhesiveness improver in 100 parts of water and then adding or not adding 0.5 part of propylene glycol to the solution. Each photoresist was coated onto the inner surface of the front panel of a 20-inch color television receiver by a rotational coater and then dried by an infrared heater provided with ten 200 W lamps on the whole of one side for 3 minutes, drying having been finished at a panel temperature of 45° C. A ultraviolet ray was irradiated through a shadow mask, in which holes of 0.34 mm in diameter were two-dimentionally arranged at a pitch of 0.65 mm, at an illuminance of 1500 luxes for two minutes, and development was carried out by a water spray (water pressure 1 kg/cm$^2$). As a result, the photoresist containing propylene glycol produced no unevenness in image in contrast with the photoresist containing no propylene glycol. Also, the unevenness produced in the photoresist containing no propylene glycol was due to a difference in the size of the formed dot image. The reason therefor is considered to be a difference in sensitivity caused by nonuniformity in the film thickness of photoresist or the drying degree of film.

EXAMPLE 3

Two photoresists were prepared by dissolving a mixture of 1.5 parts of polyvinyl pyrrolidone and 1 part of gelatine as a water-soluble polymer substance, 0.3 part of sodium 4,4'-diazidostilbene-2,2'-disulfonate as a bisazide crosslinking agent, and 0.02 part of N-$\beta$-(aminoethyl)-$\gamma$-aminopropylmethyldimethoxysilane as an adhesiveness improver in 100 parts of water and then adding or not adding 2 parts of 1,3-butylene glycol as an alcohol. Each photoresist was subjected to the same experiment as described in Example 2. It was found that the image produced with the photoresist containing the alcohol produced no unevenness.

What is claimed is:

1. In a process for forming a photosensitive photoresist layer on a glass substrate in which a photoresist composition is coated on said substrate, said substrate is rotated so that said photoresist composition is distributed on said substrate uniformly and said composition is thereafter allowed to dry, the improvement wherein said photoresist composition comprises an aqueous solution containing water, a bisazide photo-crosslinking agent, a water-soluble polymeric substance capable of being photo-crosslinked by said bisazide photo-crosslinking agent, and a dihydric alcohol having a molecular weight of 60 to 110 in an amount sufficient to increase the fluidity of said composition and retard the drying rate of water from said composition so that the photoresist layer formed by coating said composition onto a substrate and drying has a uniform film thickness; said composition containing 5 to 300 parts by weight of said alcohol per 100 parts by weight of said water-soluble polymeric substance.

2. A process according to claim 1, wherein the substrate is the front panel of a color television receiver.

3. A process according to claim 1, wherein the dihydric alcohol is ethylene glycol.

4. A process according to claim 1, wherein the dihydric alcohol is propylene glycol.

5. A process according to claim 1, wherein the dihydric alcohol is 1,3-butylene glycol.

6. A process according to claim 1, wherein the dihydric alcohol is diethylene glycol.

7. A process according to claim 1, wherein the dihydric alcohol is 1,5-pentanediol.

* * * * *